Figure 1:
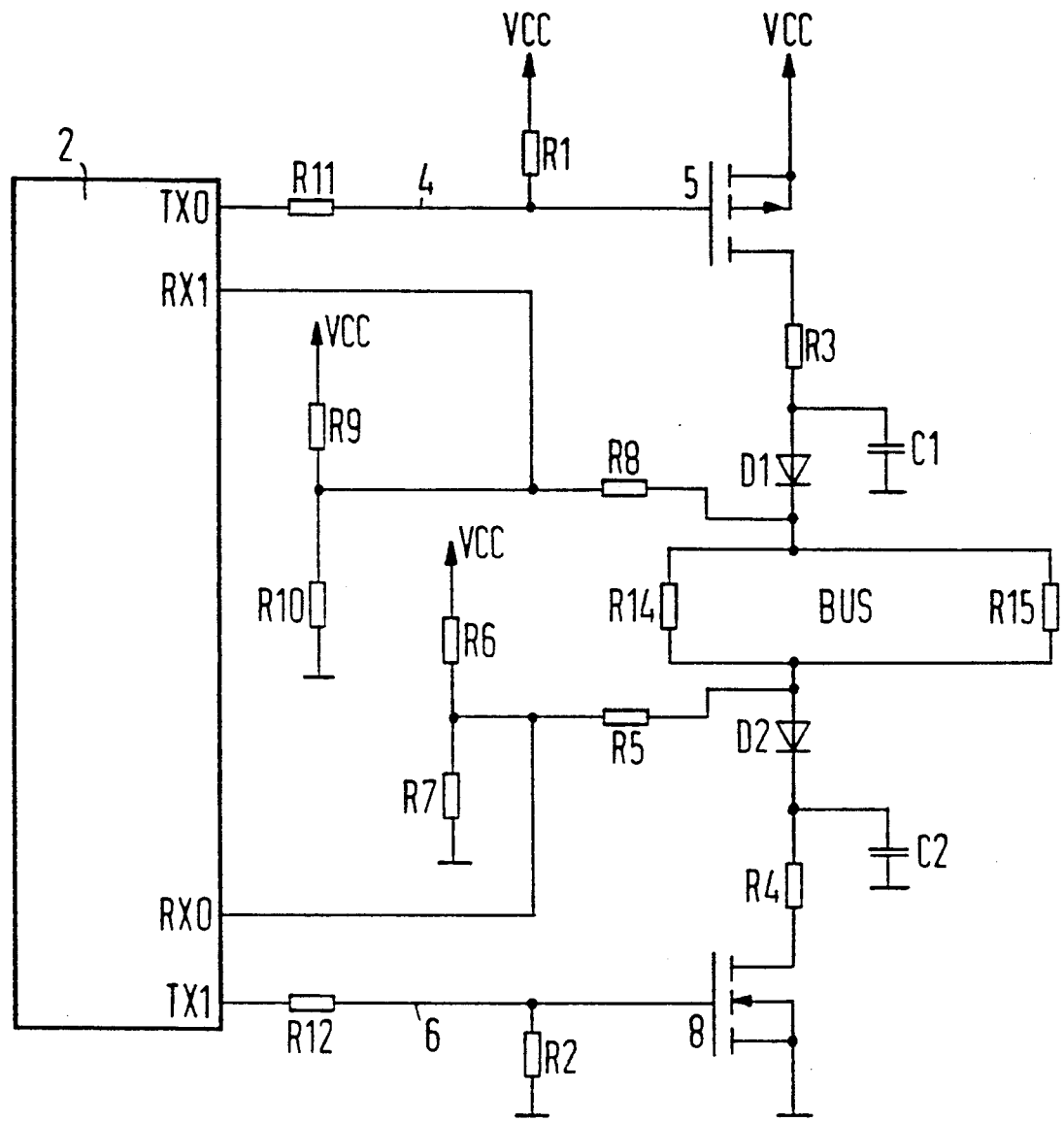

United States Patent [19]
Fisch et al.

[11] Patent Number: 5,323,072
[45] Date of Patent: Jun. 21, 1994

[54] INTERFACE CIRCUIT WHICH SUPPRESSES INTERFERENCE

[75] Inventors: Alfons Fisch, Falkenstein; Hartmut Gerken, Nittendorf-Undorf, both of Fed. Rep. of Germany

[73] Assignee: Siemens Aktiengesellschaft, Munich, Fed. Rep. of Germany

[21] Appl. No.: 950,202

[22] Filed: Sep. 24, 1992

[30] Foreign Application Priority Data

Sep. 24, 1991 [EP] European Pat. Off. ............ 91116270

[51] Int. Cl.⁵ ............................ H03B 1/04; H03K 5/12
[52] U.S. Cl. ................................. 307/542; 307/262; 307/263; 307/270
[58] Field of Search ............................. 307/262–263, 307/, 270, 542

[56] References Cited

U.S. PATENT DOCUMENTS

| | | | |
|---|---|---|---|
| 3,839,679 | 10/1974 | Hughes | 307/242 |
| 4,959,565 | 9/1990 | Knecht et al. | 307/542 |
| 5,057,705 | 10/1991 | Uchikoshi | 307/262 |
| 5,198,699 | 3/1993 | Hashimoto et al. | 307/270 |

FOREIGN PATENT DOCUMENTS

| | | |
|---|---|---|
| 0337762 | 10/1989 | European Pat. Off. . |
| 0368524 | 5/1990 | European Pat. Off. . |
| 0416679 | 3/1991 | European Pat. Off. . |

*Primary Examiner*—Margaret R. Wambach
*Attorney, Agent, or Firm*—Herbert L. Lerner; Laurence A. Greenberg

[57] ABSTRACT

An assembly has a control component with outputs, and a data transmission bus with leads. An interface circuit or an integrated driver component for connecting the control component to the data transmission bus includes two drivers each having an input and an output. The outputs of the drivers are each connected to a respective one of the leads of the bus. Each of two series resistors is connected between a respective one of the outputs of the control component and the input of a respective one of the drivers for controlling the drivers with the control component. Each of two capacitors is connected between ground and a respective one of the outputs of the drivers connected to the leads of the bus.

2 Claims, 1 Drawing Sheet

INTERFACE CIRCUIT WHICH SUPPRESSES INTERFERENCE

The invention relates to an interface circuit for connecting a control component to a data transmission bus, including two drivers being controlled by the control component and connected to leads of the bus.

Such an interface circuit serves to connect a control component to a data transmission bus. The control component controls communication over the bus. It is connected in turn to some arbitrary unit that receives and sends the data to be transmitted. Such units are present in rather large numbers in a motor vehicle, for instance. Connecting the units to the bus economizes on a number of individual lines that are conventionally needed for data exchange between the units.

In a known interface circuit, the outputs of the control component are each connected to the leads of the bus through a respective driver in the form of a field effect transistor, such as the Intel 82526 CAN controller, for example.

For some applications, the known interface circuit emits an excessively high interference level. On one hand, the gate capacitor of the two transistors has its charge reversed very quickly by the two outputs of the control component. This leads to overly high signal edge rise speeds on the bus and thus to the emission of interference. On the other hand, because of its high clock rate, interference voltages are created in the control component itself, they are coupled-out of the control component by the transmission output, transmitted through the gate-to-drain capacitors of the transistors to the bus and emitted by it. However, such a provision does not meet the electromagnetic compatibility requirements for the bus system.

It is accordingly an object of the invention to provide an interface circuit, which overcomes the hereinafore-mentioned disadvantages of the heretofore-known devices of this general type and with which the emission of interference by the data transmission bus is markedly reduced.

With the foregoing and other objects in view there is provided, in accordance with the invention, in an assembly having a control component with outputs, and a data transmission bus with leads, an interface circuit for connecting the control component to the data transmission bus, comprising two drivers each having an input and an output, the outputs of the drivers each being connected to a respective one of the leads of the bus; two series resistors each being connected between a respective one of the outputs of the control component and the input of a respective one of the drivers for controlling the drivers with the control component; and two capacitors each being connected between ground and a respective one of the outputs of the drivers connected to the leads of the bus.

In accordance with a concomitant feature of the invention, the interface circuit is an integrated driver component.

The advantages of the invention are in particular that not only are interference emissions caused by overly high edge steepness on the bus and by hum frequencies coupled-out of the control component greatly reduced, but that interference emissions which are externally caused, for instance from digital lines extending in the vicinity, are also greatly damped.

Other features which are considered as characteristic for the invention are set forth in the appended claims.

Although the invention is illustrated and described herein as embodied in an interface circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

The drawing is a schematic circuit diagram of an exemplary embodiment of the invention.

Referring now to the single figure of the drawing in detail, there is seen an interface circuit 1 according to the invention.

The interface circuit 1 connects a control component 2 to a data transmission bus 3. The control component 2, such as an 82526 CAN-bus controller as mentioned above, has two outputs or transmission ports TX0 and TX1 and two inputs or reception ports RX0 and RX1. The output TX0 is connected by a line 4 to a gate of a transistor 5 that serves as an output driver. The transistor 5 may be a BSS84 p-channel MOSFET, for instance. Unless noted otherwise, the components discussed below all relate merely to one possible exemplary embodiment. The line 4 is connected to an operating voltage VCC of 5 V through a 5k (k =kiloOhm) resistor R1.

Correspondingly, the other output TX1 is connected to a gate of a transistor 8 by a line 6 and to ground through a 5k resistor R2.

The transistor 5 has a drain connected to the operating voltage VCC, and a source connected to a first lead of the bus 3 through a 33 Ω resistor R3 and a diode D1. Correspondingly, a drain of the transistor 8 is connected to a second lead of the bus 3 through a 33 Ω resistor R4 and a diode D2, and a source of the transistor 8 is connected to ground.

The circuit components described above represent a transmission branch of the interface circuit 1. Both transistors 5, 8 may either be simultaneously conducting or simultaneously not conducting. The first case is called the "dominant" state and the second case is called the "recessive" state.

The input RX0 is connected through a 3k6 (3600 Ω) resistor R5 to the second lead of the bus 3 and to a connection point of a voltage divider, which is formed by two resistors, namely a 3k48 resistor R6 and a 4k22 resistor R7.

Correspondingly, the input RX1 is connected through a 3k6 resistor R8 to the first lead of the bus 3 and to a connection point of a voltage divider including resistors R9 and R10, each of which are 3k83 resistors. The two voltage dividers are located between VCC and ground.

The resistance networks described above form a reception branch of the interface circuit 1. A 510 Ω series resistor R11 is inserted between the output TX0 of the control component 2 and the gate terminal of the transistor 5, and a 330 Ω series resistor R12 is inserted between the output TX1 and the gate terminal of the transistor 8. Through the use of these two series resistors R11 and R12, the time constant for the charge reversal of the gate capacitors of the transistors 5 and 8 is increased. The result is reduced edge steepness of the signals on the bus 3 and thus a lesser emission of interference. The two series resistors R11 and R12 are dimensioned in such a way, in every application, that the resultant edge steepness meets the requirements for the baud rate used on the bus 3. In automotive applications, the bus 3 is constructed as a serial bus with a programmed data transmission rate of up to 1 Mbaud. In the exemplary embodiment described herein, the data rate is approximately 500 Mbaud.

Although it is known from industry to insert a resistor into the line 4, it only serves to restore the symmetry of the interface circuit that was distorted by the different transistors 5 and 8. This is attained in this case by the different resistances of the series resistors R11 and R12. Terminals on the bus side of the resistors R3 and R4 are connected to ground through respective capacitors C1 and C2, each having a capacitance of 2.2 nF. Each of the capacitors C1 or C2 forms a low-pass filter together with the series resistor R3 or R4 in the applicable transmission line, which limits the edge steepness of the bus signals to a defined value and moreover additionally damps interference or hum frequencies coupled out of the control component 2. Interference signals that are coupled-in from outside are additionally damped as well.

The two series resistors R11 and R12, together with parasitic capacitances to ground or to the operating voltage such as the gate-to-source capacitance of the transistors 5 and 8, also form low-pass filters which damp the out-coupling of interference from the control component 2.

The bus 3 has a wave resistance of 120 Ω. The bus has a "near" end connected to the interface circuit 1 and a "far" end, at each of which it is closed off by a respective resistor R14 and R15, each of 120 Ω.

It is also suitable for the driver transistors 5 and 8 and others of the circuit components described above to be combined into an integrated circuit which is constructed, for instance, as an integrated driver component.

We claim:

1. In an assembly having a control component with outputs, and a data transmission bus with leads, an interference suppressing interface circuit for connecting the control component to the data transmission bus, comprising:

two drivers each having an input and an output, the outputs of said drivers each being connected to a respective one of the leads of the bus;

two series resistors each being connected between a respective one of the outputs of the control component and the input of a respective one of said drivers for controlling said drivers with the control component; and two capacitors for damping interference each being connected between ground and a respective one of the outputs of said drivers connected to the leads of the bus.

2. In an assembly having a control component with outputs, and a data transmission bus with leads, an interference suppressing integrated driver component for connecting the control component to the data transmission bus, comprising:

two drivers each having an input and an output, the outputs of said drivers each being connected to a respective one of the leads of the bus;

two series resistors each being connected between a respective one of the outputs of the control component and the input of a respective one of said drivers for controlling said drivers with the control component; and two capacitors for damping interference each being connected between ground and a respective one of the outputs of said drivers connected to the leads of the bus.

* * * * *